(12) United States Patent
Kelly et al.

(10) Patent No.: US 7,684,480 B2
(45) Date of Patent: *Mar. 23, 2010

(54) METHOD AND SYSTEM FOR EQUALIZATION OF A REPLACEMENT LOAD

(75) Inventors: Campbell Kelly, Frauenfeld (CH); Manville Smith, Coconut Creek, FL (US); Bruce MacMillan, Phoenix, AZ (US); Felix Matro, Phoenix, AZ (US); Carl Lindquist, Phoenix, AZ (US)

(73) Assignee: JL Audio, Inc., Miramar, FL (US)

( * ) Notice: Subject to any disclaimer, the term of this patent is extended or adjusted under 35 U.S.C. 154(b) by 500 days.

This patent is subject to a terminal disclaimer.

(21) Appl. No.: 11/565,336

(22) Filed: Nov. 30, 2006

(65) Prior Publication Data

US 2007/0133669 A1 Jun. 14, 2007

Related U.S. Application Data

(63) Continuation of application No. 10/974,233, filed on Oct. 27, 2004, now Pat. No. 7,167,515.

(51) Int. Cl.
*H03H 7/30* (2006.01)
*H03H 7/40* (2006.01)
*H03K 5/159* (2006.01)

(52) U.S. Cl. .................. 375/229; 375/232; 381/103
(58) Field of Classification Search .................. 375/229, 375/232, 231; 381/103, 1, 22; 704/228
See application file for complete search history.

(56) References Cited

U.S. PATENT DOCUMENTS 6,897,725 B2 * 5/2005 Honda ............ 330/207 A
7,167,515 B2 * 1/2007 Kelly et al. ............ 375/229

* cited by examiner

*Primary Examiner*—Phuong Phu
(74) *Attorney, Agent, or Firm*—Pablo Meles; Akerman Senterfitt

(57) ABSTRACT

A system (10) and method (50) of equalizing an audio signal from an existing radio or head unit (30) using an interface unit (10) between the radio or head unit and a replacement load (34) can include the steps analyzing (64) an existing equalization to provide a measure of an existing frequency response, generating (66) a substantially inverted frequency response to the existing frequency response, and applying (74) the inverted frequency response to the replacement load to provide a desired response. Such as system can include an interface unit (12) having an automatic input level control unit (14), an analog to digital converter or digitizer (16), a DSP (18) providing an output to a DAC (20), a level booster unit (22) and a processor such as a microcontroller unit (24).

21 Claims, 2 Drawing Sheets

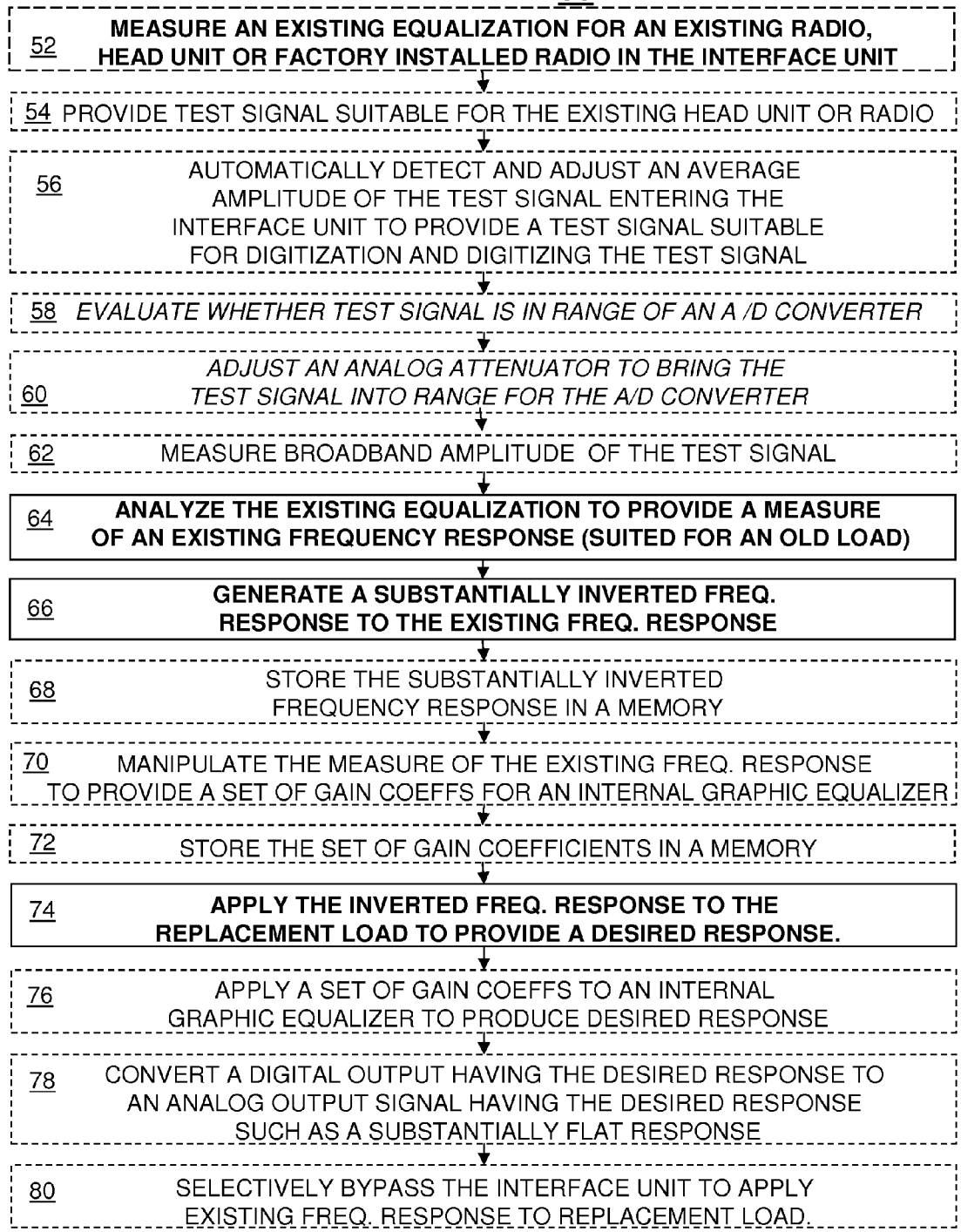

METHOD AND SYSTEM FOR EQUALIZATION OF A REPLACEMENT LOAD

CROSS REFERENCE TO RELATED APPLICATION

The present application is a Continuation of U.S. application Ser. No. 10/974,233, filed on Oct. 27, 2004 and claims priority thereto.

FIELD OF THE INVENTION

This invention relates generally to equalization of audio equipment, and more particularly to a method and system for equalizing a replacement load for system having a predefined equalization for a predetermined load.

BACKGROUND OF THE INVENTION

Stereo systems for existing vehicles commonly have a fixed equalization setting that is specifically designed for a particular vehicle, stereo system and load in terms of amplifiers and speakers. In most instances, existing vehicles tend to have integrated dashboards that fail to provide easy provisioning or removal of entertainment devices such as the factory installed stereo equipment. Such scenario creates problems for anyone wishing to install a replacement system or alternative amplifiers or loudspeakers since the factory-installed radio is likely to contain a fixed equalizer which corrects for deficiencies in the original speaker system. Such fixed equalizer will more than likely be inappropriate for the replacement system. No existing system enables the easy modification of an audio output of a built-in radio in such a way as to remove the factory equalization. To appropriately equalize a replacement system in most existing systems today, a skilled technician using test equipment is typically needed to set up a manually-controlled graphic equalizer.

For example, EQS by AudioControl is a standard analog multi-channel manual equalizer. The EQS requires manual adjustment of equalization which still requires an analyzer and technical skills to provide optimal equalization. Again, no existing system enables an easy or automatic modification of an audio output of a built-in radio in such a way as to remove the factory equalization and provide a suitable equalization for a replacement system.

SUMMARY OF THE INVENTION

Embodiments in accordance with the present invention can provide automatic modification of an audio output of a built-in radio in such a way as to remove the factory equalization.

In a first embodiment of the present invention, a method of equalizing an audio signal from a factory installed radio using an interface unit between the factory installed radio and a replacement load can include the steps of analyzing an existing equalization to provide a measure of an existing frequency response (suited for an old load), generating a substantially inverted frequency response to the existing frequency response, and applying the inverted frequency response to the replacement load to provide a desired response. The method can also include the step of measuring the existing equalization (using the interface unit) for the factory installed radio. The step of measuring can include providing a test signal suitable for the factory installed radio and automatically detecting and adjusting an average amplitude of the test signal entering the interface unit to provide a test signal suitable for digitization whereupon the test signal can be digitized. The method can further include the step of evaluating whether the test signal is in a range of an analog to digital converter and adjusting an analog attenuator as required to bring the test signal into the range for the analog to digital converter. The measuring step can further include the step of measuring a broadband amplitude of the test signal. Once the test signal is within the range of the analog to digital converter the measuring step can further include the step of measuring an amplitude of the test signal at a number of predetermined frequencies where each predetermined frequency corresponds to a center frequency of a equalizer band. The step of generating the substantially inverted frequency responses can include the step of mathematically manipulating the measure of the existing frequency response to provide a set of gain coefficients for an internal equalizer. The substantially inverted frequency response can be stored in a memory and more specifically the set of gain coefficients can be stored in the memory. The step of applying the inverted frequency response can include applying the set of gain coefficients to an internal equalizer to produce the desired response. The method can then convert a digital output having the desired response to an analog output signal having the desired response such as a substantially flat response. Optionally, the method can also include the ability to bypass the interface unit to apply the existing frequency response to the replacement load.

In a second embodiment of the present invention, an interface unit for use between an existing vehicle radio and a replacement load (such as an amplifier and a speaker) can include an analog attenuator capable of adjusting various amplitudes of an input signal to a common amplitude, an analog to digital (A/D) converter for converting a plurality of analog test signals from the existing vehicle radio to digital test signals and a processor coupled to the analog to digital converter. The processor can be programmed to analyze an existing equalization to provide a measure of an existing frequency response (suited for an old load), generate a substantially inverted frequency response to the existing frequency response, and apply the inverted frequency response to the replacement load to provide a desired response. The processor can be programmed to measure (using the interface unit) an existing equalization for the factory installed radio. The processor can be further programmed to measure an average amplitude of a test signal, evaluate whether the test signal is in an range of the analog to digital converter, and adjust the analog attenuator as required to bring the test signal into the range for the analog to digital converter. The processor can further be programmed to perform many of the steps in the method described in the paragraph above and such functions can be performed by one or more digital signal processors or a digital signal processor (DSP) working in conjunction with a microcontroller unit (MCU). The interface unit can further include a memory for storing the inverted frequency response. The interface unit can further include a digital to analog converter for converting a digital output having the desired frequency response to an analog output having the desired frequency response. A level-shifting and gain stage can also be coupled to an output of the digital to analog converter. Optionally, the interface unit can include a means for selectively bypassing the interface unit to enable the application of an existing equalization from the existing vehicle radio to the replacement load.

Other embodiments, when configured in accordance with the inventive arrangements disclosed herein, can include a system for performing and a machine readable storage for causing a machine to perform the various processes and methods disclosed herein.

BRIEF DESCRIPTION OF THE DRAWINGS

FIG. 2 is a flow chart illustrating a method of equalizing an audio signal from a factory installed radio using an interface unit between the factory installed radio and a replacement load in accordance with an embodiment of the present invention.

DETAILED DESCRIPTION OF THE DRAWINGS

Figure 1:
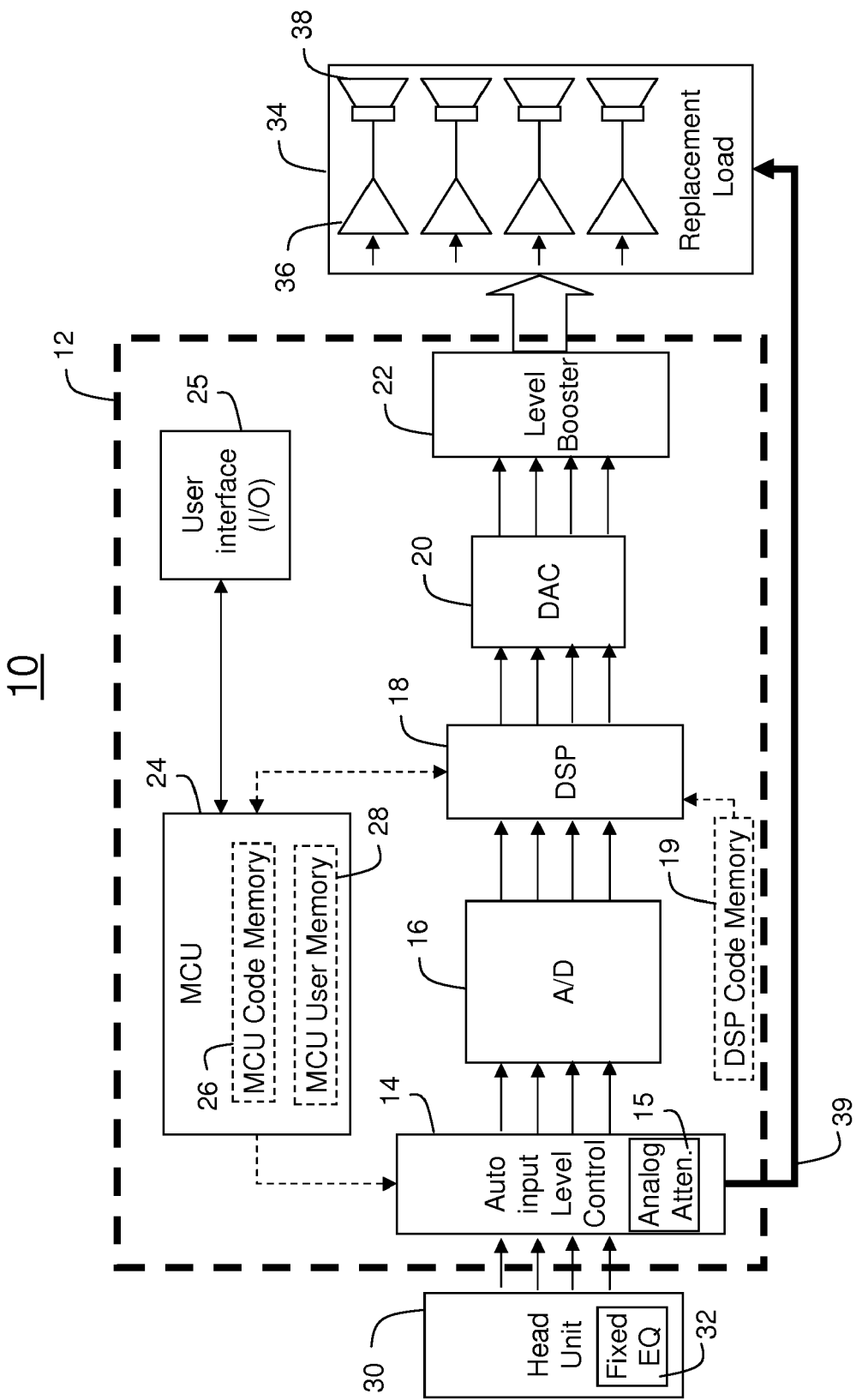
FIG. 1 is a block diagram of an audio system including an interface unit in accordance with an embodiment of the present invention.

While the specification concludes with claims defining the features of embodiments of the invention that are regarded as novel, it is believed that the invention will be better understood from a consideration of the following description in conjunction with the figures, in which like reference numerals are carried forward.

Referring to FIG. 1, an audio system 10 including an interface unit 12 coupled between a head unit 30 and a replacement load 34 is shown. The head unit 30 can have a fixed or a predetermined or pre-existing equalization scheme 32 that was ideally suited for a load such as a factory installed speaker system for a particular vehicle environment. Once the vehicle environment or the load is altered from the factory designed system and environment, the equalization 32 is more than likely unsuitable for the current environment or for a replacement load. The replacement load 34 can include at least one among an amplifier 36 and a speaker 38 for example.

The interface unit 12 can generally include an automatic input level control unit 14, an analog to digital converter or digitizer 16, a digital signal processor 18, a digital to analog converter (DAC) 20, a level booster unit 22 as well as a processor such as a microcontroller unit 24. The automatic level control unit 14 can include an analog attenuator 15. Operationally, the automatic level control unit 14 receives an analog audio output from the head unit 30 as an input and can be controlled by the processor 24. The signaling can be on 4 channels as shown, but the additional or auxiliary channels can likewise be accommodated in accordance with the embodiments of the present invention. The processor 24 can be used to measure an average amplitude of a test signal to evaluate whether the test signal is in an range of the analog to digital converter 16 and to adjust the analog attenuator 15 as required to bring the test signal into the range for the analog to digital converter 16. The processor 24 can also receive measured results from the DSP 18 and in turn provide gain values or coefficients back to the DSP 18. In this particular embodiment, the analog to digital converter 16 converts four channels of analog audio to digital audio which get processed by the DSP 18 and provided to the DAC 20. The digital audio signals going to and from the DSP 18 can be in high-speed I2S format where each stream carries a 24-bit stereo pair for example. The numerical data passing between the DSP 18 and the processor 24 can use a slower SPI protocol and a custom format for example. Furthermore, user volume control can be achieved digitally within DSP 18. The level booster unit 22 is can be used to compensate for automotive power amplifiers that are generally driven at several volts of input.

The interface unit 12 in various embodiments can include memory in different locations. For example, the DSP 18 can have a main program memory 19 in the form of an external non-volatile memory chip which generally doesn't change in operation unless reprogrammed by a factory or other authorized user. The processor 24 can also include main program memory 26 that can come in the form of non-volatile memory internal to a MCU for example. Once again, memory 26 generally doesn't change in operation unless reprogrammed by a factory or other authorized user. The processor 24 can also include a memory 28 such as parameter storage in the form of electrically erasable and reprogrammable non-volatile memory (EEPROM) internal to a MCU. The contents of memory 28 can change when a user carries out a calibration procedure and also when the user changes the volume setting or an input channel using an external remote control device for example. Memory 28 can hold the current equalization and user settings so the interface device 10 powers up correctly after it has been switched off. It should be understood that memory in numerous different forms can be used within the scope of the embodiments herein. Note, non-volatile memory is generally used for program memory while EEPROM memory is generally used for parameter storage memory although no such usage implication is necessarily implied herein.

In order to flatten the existing equalization in the head unit or the factory equalization, it must first be measured. More specifically, in one embodiment, a CD player in the radio can be used to send a test signal to the interface unit 12, where it is analyzed to produce a set of numbers which represent the response curve of the existing equalization. The interface unit 12 can use these measurements to produce a second set of numbers which control an internal equalizer (such as an internal graphic equalizer) in such a way as to reverse the existing response curve. This inverted response is stored in non-volatile memory such as memory 28. Subsequently, when the audio output of the radio or head unit 30 is fed through the interface unit 12 to the alternative audio system or replacement load 34, the inappropriate original frequency response is replaced with one which is almost flat.

Since there is generally no electrical input to the factory radio, the test signal should be in a form that can be analyzed "after the fact". The test signal can use a composite signal consisting of multiple equal-amplitude tone at equal harmonic intervals across the audio band such as of thirty equal amplitude tones on $\frac{1}{3}^{rd}$-octave intervals between 24.6 Hz and 20.0 kHz. This signal can be provided as an audio track on a CD. The individual tones in the test signal can correspond to the center frequencies of a multi-band digital "graphic" equalizer which is the principle audio component of the interface unit 12.

Initially, the interface unit 12 can be placed in a calibration mode while the test CD is being played into the interface unit 12. The calibration mechanism can be fully automatic once a calibrate button or function has been activated via a user interface 25 within or partially or wholly external to the interface unit. The user interface 25 can include indicator lights, control buttons or an interactive display or even a voice recognition system or other means for bypassing (defeating), calibrating, resetting, and adjusting volumes, gain, or other parameters in accordance with the embodiments herein. In each of the four channels, the test signal can be digitized and fed to the DSP 18 which returns four broadband root mean square (rms) amplitudes to the MCU 24. In the MCU 24, this amplitude can be compared to a predetermined limit value. If any signal is above this limit, the MCU 24 can activate a single stage fixed analog attenuator in that channel in the automatic input level control unit 14.

Once each fixed attenuator has been set up, new rms values are calculated by the DSP 18 and used by the MCU 24 to adjust digitally-controlled potentiometers in each channel so as to produce a constant level at the inputs to the digitizer 16. This adjustment can implement an eight-step successive approximation technique in the MCU 24, with the four rms measurements repeated in the DSP 18 at each step and used by the MCU 24 to set or clear one bit of the digital control byte for each of the four potentiometers. This process ensures that the digitizer 16 will subsequently see signals which lie within its optimal range. Each of the four input signals can be digitized simultaneously at 24-bit resolution and 48 ks/s, using a commercial sigma-delta audio digitizer. The four digital output streams can then be fed to the on-board DSP 18.

In the DSP 18, the raw 24-bit data from the digitizer 16 can be converted into 32-bit floating-point numbers and then filtered to extract thirty individual frequencies using the same filters as the equalizer but with their Q set to a higher value so that the output of each filter contains mostly the frequency of interest. The output of each filter can be converted to an rms value over a predetermined period such as an exact 10.00 second period. Once all the squares have been summed, the DSP 18 can calculate the averages, extract the square roots and return 120 rms estimates (for 30 bands on the 4 channels) to the MCU 24. The MCU 24 can convert the linear rms measurements to logarithmic levels in dBV, and find the mid-point of the thirty results for each channel, calculated as half the difference between the highest and the lowest result. The MCE 24 can then subtract the appropriate mid-point from each individual result to produce a set of thirty correction factors for each channel. These numbers are returned to the DSP 18 as target gains for the 30-band equalizer.

Some mathematical manipulation of the gain targets can provide better results resembling a desired equalization. Each of the four channels of the equalizer can be thought of as being equivalent to 30 analog filters whose outputs are summed to reconstruct the full-range audio signal. If desired, each filter can have a perfectly flat passband exactly ⅓ of one octave wide, and no output at any other frequency. In practice, such filters can be difficult to implement and have undesirable side effects, particularly with regard to shifts in signal phase at the abrupt transition from the passband to each stopband. But these "ideal" filters can use the calculated target gains directly. The actual filters are digital models of simple resonators which have smooth phase characteristics and predictable passband and stopband characteristics. However, they are not flat in the passband, and they pass significant amounts of signal in the nominal stopbands. They are characterized by two parameters, center frequency and Q.

The center frequency is the single frequency at which the filter output is a maximum. The Q is a dimensionless number related to the shape of the filter response, and is specific to resonators or filters whose response resembles a resonator. Q is defined as the ratio of the center frequency to the bandwidth of the filter at the two frequencies (one above and the other below the center frequency) where the output is exactly half the output at the center frequency. Higher Q values represent narrower, more sharply-tuned, resonators.

Summing the curved passband responses of the real filters results in unwanted ripples in the output response. The amount of ripple is directly related to the Q of the filters, with higher Q values producing more ripple. However, lower Q values allow more signal to be passed in the stopbands of each filter, and these unwanted signals are also summed in the output of the filter bank. So the chosen Q is a compromise between the amount of ripple which is acceptable and the amount of distortion of the overall response caused by the imperfect stop-bands.

Because the Q should be maintained at some reasonable value to control the output ripple, the calculated results from the MCU 24 can not be used directly. If all thirty gain targets were set to 0 dB, implying unity gain in each filter, the overall response would not be flat but would have a peak of at least a 6 dB at the harmonic mean frequency. If some individual band gains were significantly higher than 0 dB, as would usually be the case, the results would deviate even further from the desired flat response.

But it can be shown that the contribution of the stopband filter responses of the other filters to the passband response of any particular filter is linear and proportional to the gain of the other filters. It is therefore possible to construct a square matrix which represents the interaction of all 30 filters. The inverse of this matrix represents a solution to the 30 linear equations for a flat output. It can therefore be used to calculate new gain coefficients which, when applied to the real equalizer, produce a reasonable approximation to a flat response.

The matrix can be constructed by ordering the filters in rows by frequency, each row containing the gain of each filter at all thirty frequencies. The frequencies are ordered from lowest to highest as the index in the rows and columns increases. The gain figures can be derived from measurement or approximated by calculation from the known characteristics of the individual filters.

In the interface device 12 of FIG. 1, this matrix has been inverted, using standard techniques, to produce an inverse matrix which is stored in the DSP 18. Each element of each column of this inverse matrix is multiplied by the target gain for the corresponding frequency band, as returned by the MCU 24. The rows of the resulting matrix are then summed to produce the required gain for each of the filters.

The results are only an approximation to a desired response such as a flat response because the coefficients of the input equations are complex. The output from the full complex inverse matrix contains both amplitude and phase information, but only the amplitude of the filters can be adjusted in the real device as currently described. In the interface unit 12, a scalar input matrix corrected by multiplying each measured amplitude by the cosine of the filter phase-angle at that frequency can be used. This manipulation is equivalent to using only the real component of the complex gain. Because these are simple resonators, the filter gain at any frequency is also proportional to the cosine of the phase angle, so the actual correction consists of squaring the fractional scalar gains prior to inversion.

If additional storage is available, a method and system in accordance with the embodiments contemplated herein can also optionally provide results where phase information is further used to provide a "full" solution with full correction of results. An "all-pass" filter or digital delay line either before or after each equalization filter can be used to handle the phase information. More specifically, a "full" solution can involve a circular buffer for each audio band and each buffer can represent one complete cycle of the appropriate respective frequency. An input sample can be placed in the next location in the appropriate buffer and replaced with the sample from the buffer location representing the phase angle which was produced by the complex matrix inversion. These time-delayed samples are then filtered and summed in the usual way to produce the final output value in each audio frame. The particular buffer locations are calculated during the matrix inversion process which is part of the calibration procedure, and are fixed thereafter. Other than additional temporary storage, such a full solution can be implemented using DSPs currently available.

The DSP 18 can return the modified gain coefficients to the MCU 24, which stores them in non-volatile memory 28. At this point the system is calibrated for the particular vehicle in which it has been installed. The interface unit 12 can provide a direct indication to the user if the factory equalization in any of the four channels is beyond the range which can be compensated. The out-of-range channel will be compensated, but the compensation in one or more bands will be limited. The actual measurement results may be viewed by attaching a terminal (not shown) to the interface device or via the user interface 25 assuming the user interface includes a display.

Each time the interface unit 12 is switched on, the stored gain figures can be recovered from non-volatile memory 28 and sent to the DSP 18, which uses them to process the audio signal. Optionally, the equalizer can be bypassed via path 39, allowing the user to evaluate the degree to which the factory equalization has been corrected. The bypass state can be exited on demand or automatically after a preset time or when the unit is switched off. The bypass function can be performed by a digital switching function DSP 18 as controlled by the MCU 24. Optionally, an external control box (not shown) allows the amplitude of the overall output of the interface device 12 to be controlled from a remote location. The external control box can provide the user with a remote volume control. The external control box can also provide a means of switching between the radio inputs and a line-level stereo signal from some other source. Switching to the stereo source automatically bypasses the equalization function and distributes the stereo signal to the four outputs of the interface unit 12. The line-level path can bypass the function of the automatic input level control unit 14, and a pair of manual gain adjustments and clipping indicators can be provided instead. The clipping detection function, implemented in the DSP 18, is active at all times.

The four corrected digital outputs from the DSP 18 are converted to analog signals in a four-channel 24-bit audio DAC (20) and buffered to levels suitable to drive conventional or other automotive power amplifiers.

Referring once again to the mathematical manipulation, the matrix process is based on the supposition that the amplitude in any chosen band can be represented as the sum of the output of the filter for that band and the outputs at that band's center frequency of all the other filters. Based on the supposition, we can write a set of complex linear equations:

$$A_0 = V_0(G_0 + k_{10} G_1 + k_{20} G_2 + k_{30} G_3 \ldots + k_{n0} G_n)$$

$$A_1 = V_1(k_{01} G_0 + G_1 + k_{21} G_2 + k_{31} G_3 \ldots + k_{n1} G_n)$$

$$\ldots$$

$$A_n = V_n(k_{0n} G_0 + k_{1n} G_1 + k_{2n} G_2 + k_{3n} G_3 \ldots + G_n)$$

where $A_x$ is the output amplitude at frequency 'x'

$V_x$ is the component of the input amplitude at frequency x $G_x$ is the gain of filter 'x'

$k_{xy}$ is the contribution of filter 'x' at frequency 'y'

(noting that $k_{zz} = 1.0 + j0$ by design.)

Taking $H_n = A_n/V_n = 1.0$, and noting that the k factors are constant, these form a regular set of linear equations in G for which solutions may be found by elimination or by matrix inversion.

In matrix format, the measured k factors for each filter are entered in columns, arranged in ascending order of frequency in both axes, starting from the top left corner. The diagonal contains all 1's.

Regarding rms measurements, estimates of the rms amplitude of a signal are inherently statistical. The test waveform used for the interface device 12 can have some characteristics which make it difficult to get a good rms estimate in a reasonable length of time. In particular it can contain a number of closely spaced low frequency components which are summed. As a result, the absolute peak value of the composite waveform may not occur for many minutes, and estimates which do not contain it will be understated. This problem can be alleviated somewhat by using random starting phases for the components of the test waveform. Fortunately, all thirty components of the test waveform are present at equal amplitude. This makes the contribution of the lower frequencies to a broadband estimate quite small, and the proposed use of the broadband results to set the input attenuators is also not critical because the digitizer 16 can have good dynamic range.

But rms estimates are sensitive to the number of incomplete cycles of any single input frequency and this can cause large errors in our measured response curve where the period of the signal is some significant fraction of the acquisition time. At the lower frequencies it is highly desirable to have an integer number of waveforms in the acquisition period. After trying some sophisticated and troublesome methods to resolve this issue, it was noticed that an acquisition period of exactly 10.00 seconds gave very small errors at the two lowest frequencies, a worst-case error of 0.2% at the third lowest frequency, and smaller errors for all the higher frequencies. This is considered adequate, and the acquisition time is also acceptable.

Further note that although the digital "graphic" equalizer in the interface unit 12 reproduces the results which would be obtained using 120 narrow-band analog filters, there is in fact only one filter in the DSP 18. Its characteristics can be changed very rapidly, allowing it to simulate all 120 analog filters within a single audio sample period. This is why the term equivalent is used in some parts of the text above.

Referring now to FIG. 2, a flow chart illustrating a method 50 of equalizing an audio signal from a factory installed radio using an interface unit between the factory installed radio and a replacement load can include measuring an existing equalization for the factory installed radio in the interface unit at step 52, analyzing the existing equalization at step 64 to provide a measure of an existing frequency response suited for an old load, generating a substantially inverted frequency response to the existing frequency response at step 66, and applying the inverted frequency response to the replacement load to provide a desired response at step 74. The step of measuring can include providing a test signal suitable for the factory installed radio at step 54 and automatically detecting and adjusting an average amplitude of the test signal entering the interface unit to provide a test signal suitable for digitization at step 56 whereupon the test signal can be digitized. The method can further include the step 58 of evaluating whether the test signal is in a range of an analog to digital converter and the step 60 of adjusting an analog attenuator as required to bring the test signal into the range for the analog to digital converter. The measuring step can further include the step of measuring a broadband amplitude of the test signal at step 62. Once the test signal is within the range of the analog to digital converter the measuring step can further include the step of measuring an amplitude of the test signal at a number of predetermined frequencies where each predetermined frequency corresponds to a center frequency of a graphic equalizer band. The step of generating the substantially inverted frequency responses can include the step 70 of mathematically manipulating the measure of the existing frequency response to provide a set of gain coefficients for an internal graphic equalizer. The substantially inverted frequency response can be stored in a memory at step 68 and more specifically the set of gain coefficients can be stored in the memory as shown in step 72. The step of applying the inverted frequency response can include applying the set of gain coefficients to an internal graphic equalizer at step 76 to produce the desired response. The method 50 can then at step 78 convert a digital output having the desired response to an analog output signal having the desired response such as a substantially flat response. Optionally, the method 50 can also include the ability to bypass the interface unit to apply the existing frequency response to the replacement load at step 80.

In light of the foregoing description, it should be recognized that embodiments in accordance with the present invention can be realized in hardware, software, or a combination of hardware and software. A network or system according to the present invention can be realized in a centralized fashion in one computer system or processor, or in a distributed fashion where different elements are spread across several interconnected computer systems or processors (such as a microprocessor or microcontroller and a DSP). Any kind of computer system, or other apparatus adapted for carrying out the functions described herein, is suited. A typical combination of hardware and software could be a general purpose computer system with a computer program that, when being loaded and executed, controls the computer system such that it carries out the functions described herein.

In light of the foregoing description, it should also be recognized that embodiments in accordance with the present invention can be realized in numerous configurations contemplated to be within the scope and spirit of the claims. Additionally, the description above is intended by way of example only and is not intended to limit the present invention in any way, except as set forth in the following claims.

What is claimed is:

1. A method of equalizing an audio signal from a factory installed radio using an interface unit between the factory installed radio and a replacement load, comprising the steps of:
   analyzing in the interface unit an existing equalization of a head unit for the factory installed radio to provide a measure of an existing frequency response suited to an old load of the factory installed radio;
   generating a substantially inverted frequency response to the existing frequency response; and
   applying the inverted frequency response to the replacement load to provide a desired response.

2. The method of claim 1, wherein the method further comprises the step of storing the substantially inverted frequency response in a memory.

3. The method of claim 1, wherein the step of measuring comprises the step of providing a test signal suitable for the factory installed radio.

4. The method of claim 3, wherein the method further comprises the step of automatically detecting and adjusting an average amplitude of the test signal entering the interface unit to provide a test signal suitable for digitization.

5. The method of claim 1, wherein the step of generating the substantially inverted frequency responses comprises the step of mathematically manipulating the measure of the existing frequency response to provide a set of gain coefficients for an internal equalizer.

6. The method of claim 5 wherein the method further comprises the step of storing the set of gain coefficients in a memory.

7. The method of claim 1, wherein the step of applying the inverted frequency response comprises the step of applying a set of gain coefficients to an internal equalizer to produce the desired response.

8. The method of claim 1, wherein the method further comprises the step of converting a digital output having the desired response to an analog output signal having the desired response.

9. The method of claim 1, wherein the desired response is a substantially flat response and wherein the replacement load comprises at least a speaker and an amplifier.

10. The method of claim 1, wherein the measuring step comprises the step of measuring an amplitude of a test signal at a number of predetermined frequencies.

11. The method of claim 10, wherein each predetermined frequency corresponds to a center frequency of a equalizer band.

12. The method of claim 1, wherein the method further comprises the step of selectively bypassing the interface unit to apply the existing frequency response to the replacement load.

13. The method of claim 3, wherein the method further comprises the step of evaluating whether the test signal is in an range of an analog to digital converter.

14. The method of claim 1, wherein the method further comprises the step of measuring an existing equalization for the factory installed radio in the interface unit.

15. An interface unit for use between an existing vehicle radio and a replacement load, comprising:
   an analog attenuator capable of adjusting various amplitudes of an input signal to a common amplitude;
   an analog to digital converter coupled to the analog attenuator for converting a plurality of analog test signals from the existing vehicle radio to digital test signals; and
   a processor coupled to the analog to digital converter, wherein the processor is programmed to:
      analyze an existing equalization to provide a measure of an existing frequency response;
      generate a substantially inverted frequency response to the existing frequency response; and
      apply the inverted frequency response to the replacement load to provide a desired response.

16. The interface unit of claim 15, wherein the processor is further programmed to measure an average amplitude of a test signal, evaluate whether the test signal is in an range of the analog to digital converter, and adjust the analog attenuator as required to bring the test signal into the range for the analog to digital converter.

17. The interface unit of claim 15, wherein the interface unit further comprises a memory for storing the inverted frequency response.

18. The interface unit of claim 15, wherein the interface unit further comprises a digital to analog converter for converting a digital output having the desired frequency response to an analog output having the desired frequency response.

19. The interface unit of claim 15, wherein the replacement load comprises at least one speaker and at least one amplifier.

20. The interface unit of claim 15, wherein the processor is further programmed to measure an existing equalization in the interface unit for the existing vehicle radio.

21. A method of equalizing an audio signal from an existing head unit using an interface unit between the existing head unit and a replacement load, comprising the steps of:

analyzing in the interface unit an existing fixed equalization for the existing head unit to provide a measure of an existing frequency response suited to an old load of the existing head unit;

generating a substantially inverted frequency response to the existing frequency response; and applying the inverted frequency response to the replacement load to provide a desired response.

* * * * *